US006387551B1

(12) United States Patent
Nishioka et al.

(10) Patent No.: US 6,387,551 B1
(45) Date of Patent: *May 14, 2002

(54) STRUCTURAL BODY AND METHOD OF PRODUCING THE SAME

(75) Inventors: Masao Nishioka, Tokoname; Naotaka Kato, Owariasahi, both of (JP)

(73) Assignee: NGK Insulators, Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/407,998

(22) Filed: Sep. 29, 1999

(30) Foreign Application Priority Data

Sep. 29, 1998 (JP) .......................... 10-290105

(51) Int. Cl.⁷ .............................. B32B 15/00
(52) U.S. Cl. ...................... 428/698; 428/469; 428/472; 428/336; 427/248.1
(58) Field of Search ................. 428/698, 469, 428/472, 336; 427/248.1

(56) References Cited

U.S. PATENT DOCUMENTS 5,249,554 A * 10/1993 Tamor et al. ............ 123/90.15
5,264,681 A   11/1993 Nozaki et al. ............. 219/544
5,777,543 A    7/1998 Aida et al.

FOREIGN PATENT DOCUMENTS

EP      0310043      4/1989
JP      11-060356    3/1999

OTHER PUBLICATIONS

Patent abstracts of Japan, JP 4–21582 A, Jan. 24, 1992.
Patent abstracts of Japan, JP2–183718 A, Jul. 18, 1990.

* cited by examiner

Primary Examiner—Deborah Jones
Assistant Examiner—Gwendolyn Blackwell-Rudasill
(74) Attorney, Agent, or Firm—Parkhurst & Wendel, L.L.P.

(57) ABSTRACT

A structural body has an aluminum nitride sintered body, a silicon carbide film formed on a surface of the sintered body, and an intermediate layer generated between the sintered body and the silicon carbide film. The intermediate layer is mainly made of a silicon nitride. Preferably, the intermediate layer includes smaller than 5 wt % of carbon and smaller than 5 wt % of aluminum, and a thickness of the intermediate layer is greater than 0.2 μm.

8 Claims, 11 Drawing Sheets (2 of 11 Drawing Sheet(s) Filed in Color)

STRUCTURAL BODY AND METHOD OF PRODUCING THE SAME

BACKGROUND OF THE INVENTION

1. Field of the Invention

The present invention relates to a structural body and a method of producing the same having an excellent heat cycle resistivity.

2. Description of Related Art

Generally, an electrostatic chuck is used for chucking a semiconductor wafer and retaining it in the steps of film forming such as transfer, exposure, thermal CVD (Chemical Vapor Deposition method), plasma CVD, and sputtering of the semiconductor wafer, fine working, washing, etching, dicing and so on. As a substrate of the electrostatic chuck mentioned above, and as a substrate of the heater, dense ceramics having a high density are used recently. Especially in an apparatus for producing semiconductors, halogen corrosive gasses such as $CIF_3$ and so on are widely used as etching gas and cleaning gas. Moreover, in order to heat and cool the semiconductor wafer rapidly while it is retained, it is desired that the substrate of the electrostatic chuck has a high heat conductivity. Further, it is desired that the substrate of the electrostatic chuck has a thermal shock resistivity so as to be fractured due to a rapid temperature variation.

Dense aluminum nitride has a high corrosive resistivity with respect to the halogen corrosive gas as mentioned above. Moreover, the dense aluminum nitride is known as a material having a high heat conductivity such as a volume resistivity of greater than $10^8$ ohm-cm. In addition, the dense aluminum nitride is known as a substance having a high thermal shock resistivity. Therefore, it is thought to be preferred that the substrate of the electrostatic chuck or the heater used for producing semiconductors is formed by an aluminum nitride sintered body.

As a member having corrosive resistivity exposed to a corrosive gas in the apparatus for producing semiconductors mentioned above, the inventors studied a corrosion resistive member in which a silicon carbide film was formed on a surface of the aluminum nitride substrate by means of chemical vapor deposition method. When such a corrosion resistive member was subjected to a heat cycle was applied to the corrosion resistive member. In this case, it was found that cracks or abruptions were liable to be generated according to an increase of heat cycle numbers. If cracks were generated in the corrosion resistive member, AlN substrate was eroded by the corrosive gas, so that the silicon carbide film was peeled off.

SUMMARY OF THE INVENTION

An object of the present invention is to provide a structural body in which a silicon carbide film is formed on an aluminum nitride sintered body, which does not generate cracks or abruptions of the silicon carbide film when a heat cycle is applied to the structural body.

According to the invention, a structural body comprises an aluminum nitride sintered body, a silicon carbide film formed on a surface of said aluminum nitride sintered body, and an intermediate layer generated between said aluminum nitride sintered body and said silicon carbide film, said intermediate layer being mainly made of silicon nitride.

Moreover, according to the invention, a method of producing the structural body mentioned above, comprises the steps of flowing hydrogen at a film forming temperature; flowing a gas for a first silicon generation compound including at least silicon, chlorine and hydrogen; and flowing a gas for a second silicon generation compound and a carbon generation compound; thereby forming said silicon carbide film to said aluminum nitride sintered body by means of a chemical vapor deposition method.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

FIG. 11a is a plan view depicting one embodiment of a ceramic heater 31 according to one embodiment of the invention and FIG. 11b is a schematic cross sectional view showing the heater shown in FIG. 11a.

DESCRIPTION OF THE PREFERRED EMBODIMENT

Figure 1:
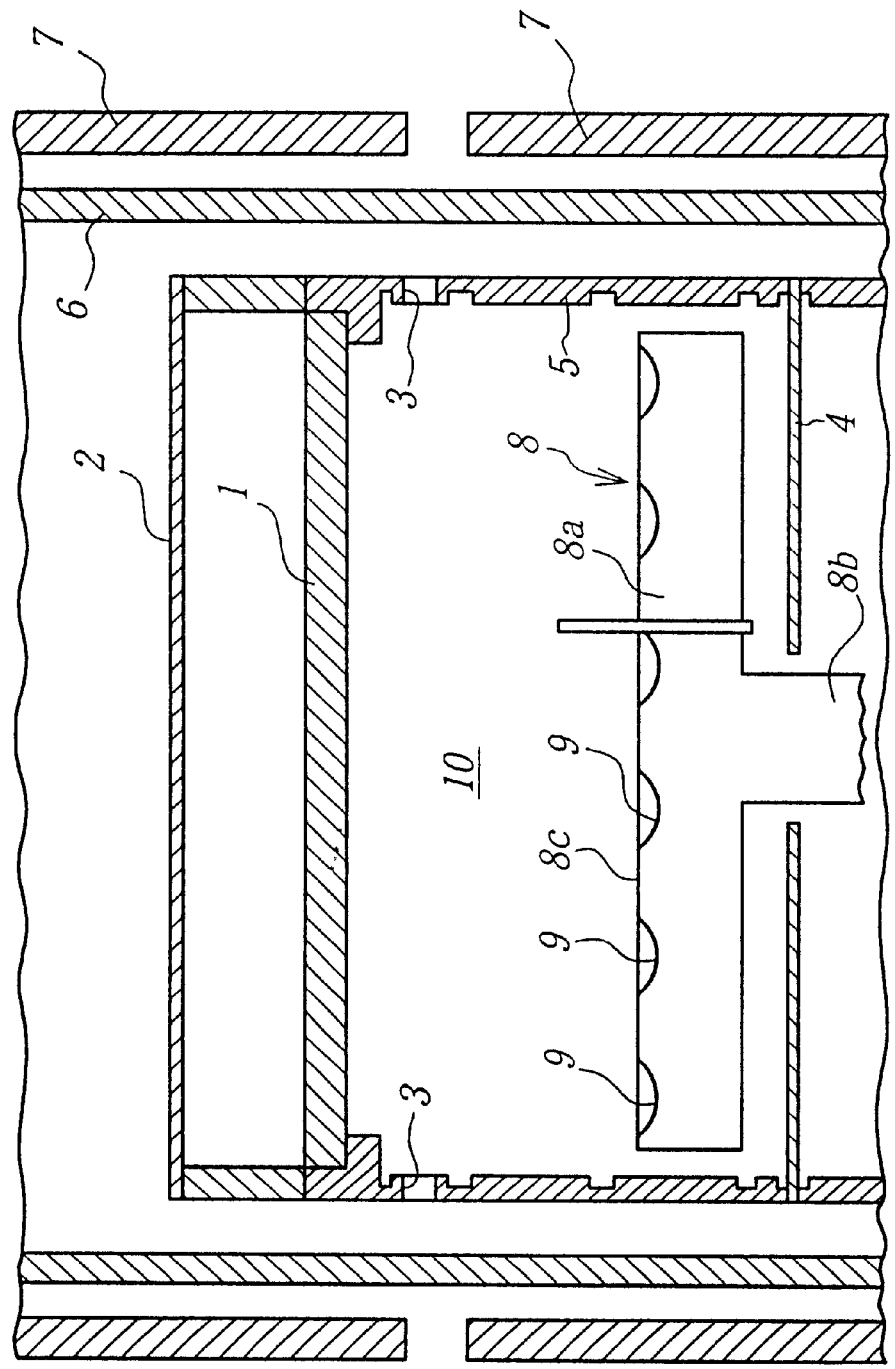
FIG. 1 is a cross sectional view showing one embodiment of a chemical vapor deposition apparatus for forming a silicon carbide film.

The inventors performed a number of screenings in such a manner that various chemical vapor deposition methods were examined, and in such a manner that a microstructure and a heat cycle test of a corrosion resistive member, in which a silicon carbide film was formed on an aluminum nitride sintered body actually, were also examined in detail. During this screening operations, the inventors found that, if the silicon carbide film was generated under a particular condition mentioned below, an intermediate layer made of mainly silicon nitride was sometimes generated on a boundary between the sintered body and the silicon carbide film, and in this case, a heat cycle resistivity was extraordinarily improved. The present invention was achieved by these findings.

In this embodiment, it is necessary that a main ingredient of the intermediate layer is silicon nitride, and it is preferred that an amount of silicon nitride is greater than 90 wt %. In the intermediate layer, aluminum originated from aluminum nitride sintered body and carbon originated from silicon carbide may be included. In this case, it is preferred that an amount of aluminum is smaller than 5 wt % and an amount of carbon is smaller than 5 wt %. Moreover, as mentioned below, in the case that use is made of a chloride gas when the silicon carbide film is generated, chlorine is included sometimes as impurities, but it is preferred that an amount of chlorine is smaller than 1 wt %.

A reason that the silicon carbide film is not peeled off from the sintered body due to a generation of the intermediate layer is not clear, but it is estimated as follows.

That is to say, a thermal stress occurs due to a difference of thermal expansion coefficient between the sintered body and the silicon carbide film. Since a thermal expansion coefficient of the silicon carbide film is smaller than that of the sintered body, a compression stress is generated in the silicon carbide film and a tensile stress is generated in the sintered body. If the silicon carbide film is arranged on the sintered body only in a physical manner without being connected, the silicon carbide film is peeled off from the sintered body due to these stresses. However, if the intermediate layer according to the invention is generated, the intermediate layer has a chemical bonding force and thus it is likely to be firmly connected to both of the sintered body and the silicon carbide film.

In order to prevent an abruption of the silicon carbide film, it is preferred to set a thickness of the intermediate layer to larger than 0.2 $\mu$m more preferably larger than 2 $\mu$m. Moreover, an upper limitation of a thickness of the intermediate layer is not generally set. However, it is difficult to make a thickness of the intermediate layer greater than a predetermined value due to an actual producing process. From this view point, it is preferred to set a thickness of the intermediate layer to smaller than 20 $\mu$m and more preferably to smaller than 10 $\mu$m from the view point of heat cycle resistivity.

A method of producing the intermediate layer is not limited, but it is preferred to use the following methods. That is to say, a method of producing the structural body, comprises the steps of, when a silicon carbide film is formed to the aluminum nitride sintered body by means of a chemical vapor deposition method; flowing hydrogen at a film forming temperature; flowing a gas for a first silicon generation compound including at least silicon, chlorine and hydrogen; and flowing a gas for a second silicon generation compound and a carbon generation compound. As the first silicon generation compound, it is preferred to use at least one compound selected from the group of $SiCl_4$, $SiHCl_3$, and $SiH_2Cl_2$. As the second silicon generation compound, it is preferred to use at least one compound selected from the group of $SiCl_4$, $SiHCl_3$, $SiH_2Cl_2$ and $SiH_4$. As the carbon generation compound, it is especially preferred to use at least one compound selected from the group of $CH_4$, $C_2H_6$ and $C_3H_8$. It is preferred that the first silicon generation compound is the same as the second silicon generation compound, but they may be different with each other.

As mentioned above, during the chemical vapor deposition step, a gas for the first silicon generation compound including at least hydrogen is introduced prior to a gas for the carbon generation compound at a high temperature. Therefore, a silicon chloride is acted with hydrogen and resolved to generate hydrogen chloride. The thus generated hydrogen chloride gas functions to corrode and activate a surface of the aluminum nitride. Here, silicon atoms are bonded to generate silicon nitride, carbon introduced after that become further reactable with silicon, and the thus generated silicon carbide is likely to be firmly connected to silicon nitride as a substrate. An introducing period of the first silicon generation compound including chlorine such as silicon tetrachloride is determined suitably according to a film generation temperature so as to generate the intermediate layer having a desired thickness. It is preferred that the film generation temperature is set to 1350–1500° C. more preferably 1400–1450° C.

Heat cycle resistivity of the sintered body and the silicon carbide film was further improved, by making a purity of aluminum nitride of the aluminum sintered body to greater than 90% more preferably greater than 94%. This is because affects of oxides in the sintered body can be reduced. Moreover, a relative density of the sintered body is preferably set to greater than 94% from the view points of strength and heat conductivity.

As a corrosive substance, it is especially important to use a reactive plasma gas used in the apparatus for producing semiconductors. As such a reactive plasma gas, there are $Cl_2$, $BCl_3$, $ClF_3$, HCl, HBr and so on, and all of them have a strong corrosive property. Among them, the structural body according to the invention shows an extraordinarily high corrosion resistivity with respect to chloride gas. Particularly, in a high temperature region of 600–1000° C., it is preferred to use the structural body according to the invention as a corrosion resistive member exposed especially to chloride gas.

The structural body according to the invention can be applied to various kinds of products. As such a product, the structural body according to the invention can be preferably applied to an electromagnetic radiation transmission member. For example, there are electromagnetic radiation transmission window, high frequency electrode apparatus, tube for generating high frequency plasma, dome for generating high frequency plasma. Moreover, the structural body according to the invention can be applied to a susceptor for setting a semiconductor wafer. As such a susceptor, there are ceramic electrostatic chuck, ceramics heater, high frequency electrode apparatus. Further, the structural body according to the invention can be used for a substrate of the semiconductor producing apparatus such as shower plate, lift pin used for supporting semiconductor wafer, shadow ring, and dummy wafer.

In the case that the structural body according to the invention is applied to the member which is set in plasma, there is an advantage such that a charge-up level of a surface of the structural body in plasma can be reduced by means of the silicon carbide film. Especially in the case that the structural body according to the invention is applied to the suscepter set in plasma, it is possible to reduce charge generation on a surface of the suscepter since the surface of the suscepter is covered with the silicon carbide film having a semi-conductive property.

Moreover, in another embodiment of the present invention, the structural body according to the invention can be applied to the electrostatic chuck.

Generally, the electrostatic chuck was produced by embedding a metal electrode in the substrate made of an aluminum nitride sintered body. In the method mentioned above, it is difficult to maintain a spacing between the electrode and a chucking surface of the sintered body at a constant level, and thus there is a drawback such that an electrostatic chucking force is liable to be varied in the chucking surface. Moreover, since it is necessary to protect the metal electrode from corrosive atmospheres, it is necessary to increase a total thickness of the substrate. Therefore, there is a tendency such that a heat capacity of the electrostatic chuck becomes larger. If the heat capacity becomes larger, it takes an additional time for heating and cooling operations.

Contrary to this, the electrostatic chuck can be obtained by forming the silicon carbide film on one surface of aluminum nitride sintered body according to the invention, wherein the silicon carbide film is used as the electrostatic chuck electrode and the sintered body is used as a dielectric layer. In this case, it is easy to maintain a thickness of the sintered body at a constant level by means of a mechanical working, a chucking force is not varied in the chucking surface. Moreover, the silicon carbide film has a high durability with respect to corrosive atmospheres and is easy to make a thickness of the sintered body thinner as compared with the metal electrode. In addition, if the sintered body is made thinner, the silicon carbide film has no problem as compared with the metal embedded electrode. Therefore, it is possible to make a total heat capacity of the electrostatic chuck smaller.

Hereinafter, experimental results will be shown in detail.
(Experiment 1)

A silicon carbide film was formed on an aluminum nitride sintered body by using a chemical vapor deposition (CVD) apparatus shown schematically in FIG. 1. A substrate 1 was set in a furnace. The substrate 1 was supported by a supporting member 5. In this apparatus, a supply tube 8 having a front shape of character T was set. The raw material supply tube 8 comprises a base portion 8b and a blowing portion 8a extended breadthwise. A predetermined number of gas discharge outlets 9 were arranged at a surface 8c opposed to a substrate of the blowing portion 8a. A numeral 6 was an inner cylindrical member and a numeral 7 was an external heater.

A spacing between the surface 8c of the raw material supply tube 8 and the substrate 1 was set to 100 mm–300 mm. A gas was fed from the gas discharge outlets 9 while the raw material supply tube 8 was rotated. A raw material gas for CVD was fed from the gas discharge outlets 9, flowed in a space 10, encountered to a surface of the substrate 1, flowed along a surface of the substrate 1, and was fed through gas discharge holes 3 formed in the supporting member 5.

Since use was made of the raw material supply tube 8 having the shape mentioned above and a gas was discharged while the raw material supply tube 8 was rotated, a thickness of the silicon carbide film which covered overall surface of the substrate 1 could be maintained at a constant level.

In this apparatus, at a film generation temperature, hydrogen was flowed in the furnace, silicon tetrachloride was supplied after that and then silicon tetrachloride and methane were supplied in addition. After the CVD process, the silicon carbide film was subjected to a grinding operation, so that a product having a predetermined could be obtained.

A structural body was produced according to the method mentioned above by using the apparatus shown in FIG. 1. As the substrate 1, use was made of a discoid aluminum nitride sintered body having a diameter of 250 mm and a thickness of 20 mm. A purity of aluminum nitride in the sintered body was 99.5% and a remainder was made of yttria. Respective raw material gases was introduced according to respective conditions shown in Table 1, so as to form a silicon carbide film. A pressure during a film formation was 120 Torr. A thickness of the silicon carbide film was 100 $\mu$m at a center portion of the film. In a comparative example 1, argon was only flowed in the furnace during a temperature ascending operation up to 1425° C., and hydrogen, silicon tetrachloride, methane were flowed at 1425° C. In examples 1, 2, 3 according to the invention, argon was only flowed in the furnace during a temperature ascending operation up to respective film forming temperatures, hydrogen was only flowed for 10 minutes at respective film forming temperatures after that, then hydrogen and silicon tetrachloride were flowed for 1 minute, and then methane was flowed in addition.

Figure 2:
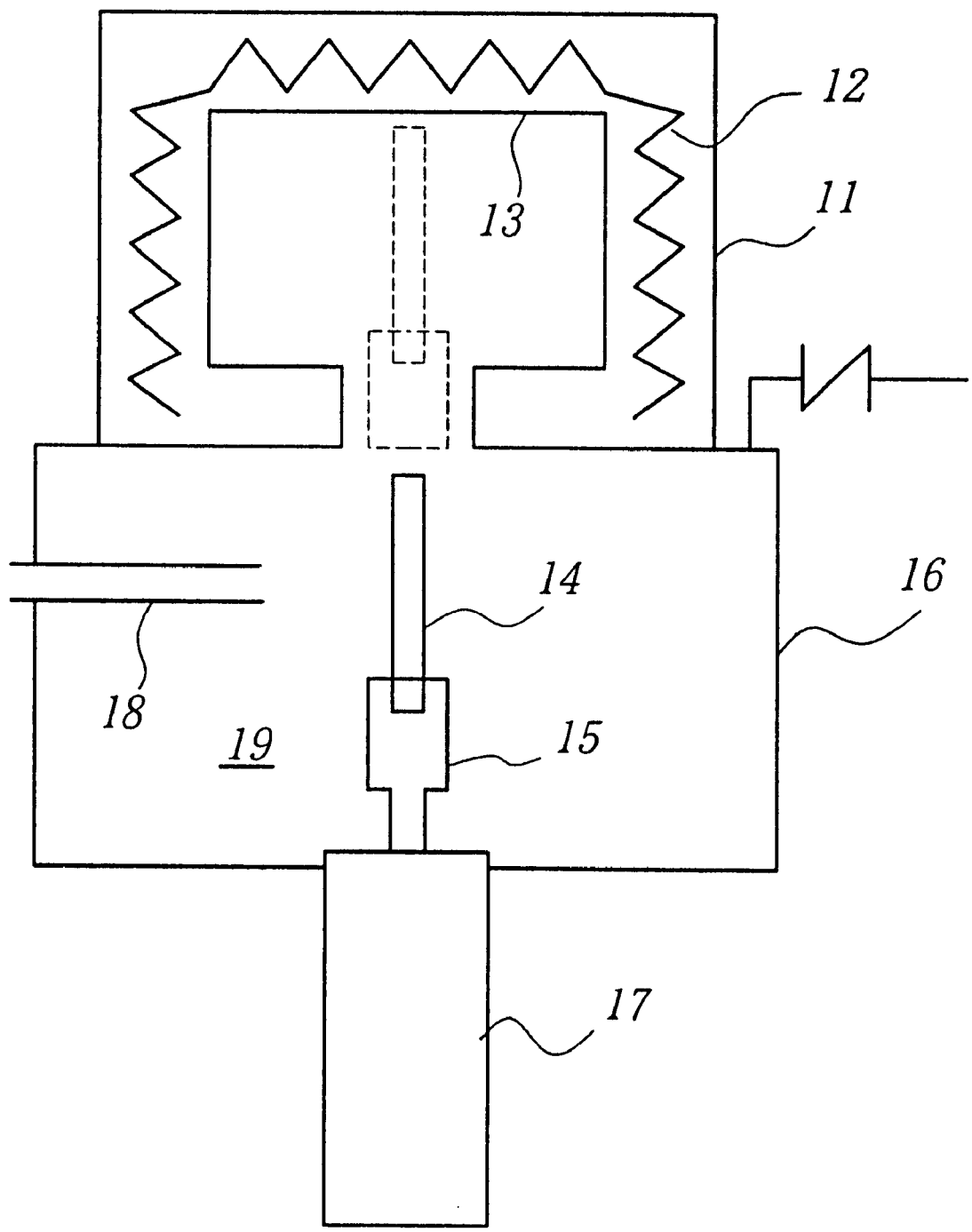
FIG. 2 is a schematic view illustrating one embodiment of a test apparatus for heat cycle test.

With respect to respective structural bodies thus prepared, a heat cycle test at a temperature range between room temperature and 900° C. was performed. In this case, use was made of a heat cycle test apparatus shown schematically in FIG. 2. Sample pieces each having a rectangular shape of 4 mm×3 mm×50 mm were cut out from respective structural bodies. In this case, the silicon carbide film was arranged on a plane defined by 4 mm×50 mm. The thus prepared sample piece 14 was supported by a chuck member 15 made of Inconel in a space 19 maintained at room temperature. A portion between a resistance heating furnace 11 and a cylinder 17 was covered with a closed vessel 16, and an argon gas under atmosphere pressure was flowed in the closed vessel 16. An outer wall of the resistance heating furnace 11 was covered with a metal plate in a highly hermetic manner.

The sample piece 14 was inserted into a furnace inner space 13 of the resistance heating furnace 11 by driving the air pressure cylinder 17. A numeral 12 was a resistance heater. A temperature of the furnace inner space 13 was maintained at 900° C. The sample piece 14 was maintained for 1 minute in the furnace inner space 13, and then it was pulled out from the furnace inner space 13 by driving the air pressure cylinder 17. An argon gas was blown from a nozzle 18 having a diameter of 2 mm at a rate of 2 litter/minute and the sample piece 14 was cooled down for 1 minute. A temperature of the sample piece 14 when it was completely pulled out from the furnace inner space 13 was lower than 30° C. An argon gas blown from the nozzle 18 was discharged into an atmosphere through a check valve arranged to the closed vessel 16. By using the test apparatus as mentioned above, a heat cycle resistive property of the sample piece was examined while an oxidation of the aluminum nitride in an argon atmosphere was prevented. These results are shown in Table 1.

TABLE 1

| | | raw material gas introducing method unit: litter/minute | | | | | | | | |
|---|---|---|---|---|---|---|---|---|---|---|
| | | temperature ascending time | 10 min. | 1 min. | predetermined time | \multicolumn{5}{c}{results of heat cycle test} | | | | |
| | | | | | | 10 | 100 | 1000 | 10000 | 50000 |
| comparative example 1 film forming temperature 1425° C. | Ar $H_2$ $SiCl_4$ $CH_4$ | 7.5 | | | 7.5 17.5 5.2 4 | 0/5 | — | — | — | — |

TABLE 1-continued

| | | raw material gas introducing method unit: litter/minute | | | | results of heat cycle test | | | | |
|---|---|---|---|---|---|---|---|---|---|---|
| | | temperature | | | predetermined | | | | | |
| | | ascending time | 10 min. | 1 min. | time | 10 | 100 | 1000 | 10000 | 50000 |
| example 1 | Ar | 7.5 | 7.5 | 7.5 | 7.5 | 5/5 | 5/5 | 5/5 | 5/5 | 5/5 |
| film forming | $H_2$ | | 17.5 | 17.5 | 17.5 | | | | | |
| temperature | $SiCl_4$ | | | 5.2 | 5.2 | | | | | |
| 1425° C. | $CH_4$ | | | | 4 | | | | | |
| example 2 | Ar | 7.5 | 7.5 | 7.5 | 7.5 | 5/5 | 5/5 | 5/5 | 3/5 | 0/5 |
| film forming | $H_2$ | | 17.5 | 17.5 | 17.5 | | | | | |
| temperature | $SiCl_4$ | | | 5.2 | 5.2 | | | | | |
| 1400° C. | $CH_4$ | | | | 4 | | | | | |
| example 3 | Ar | 7.5 | 7.5 | 7.5 | 7.5 | 5/5 | 5/5 | 5/5 | 5/5 | 5/5 |
| film forming | $H_2$ | | 17.5 | 17.5 | 17.5 | | | | | |
| temperature | $SiCl_4$ | | | 5.2 | 5.2 | | | | | |
| 1450° C. | $CH_4$ | | | | 4 | | | | | |

In the comparative example 1, all the five sample pieces show a result such that the film was peeled off from the substrate by at best 10 heat cycles. In the examples 1 and 3, there was no abruption of the film even after 50000 heat cycles. In the example 2, three sample pieces among five sample pieces show no abruption of the film after 10000 heat cycles.

Figure 3:
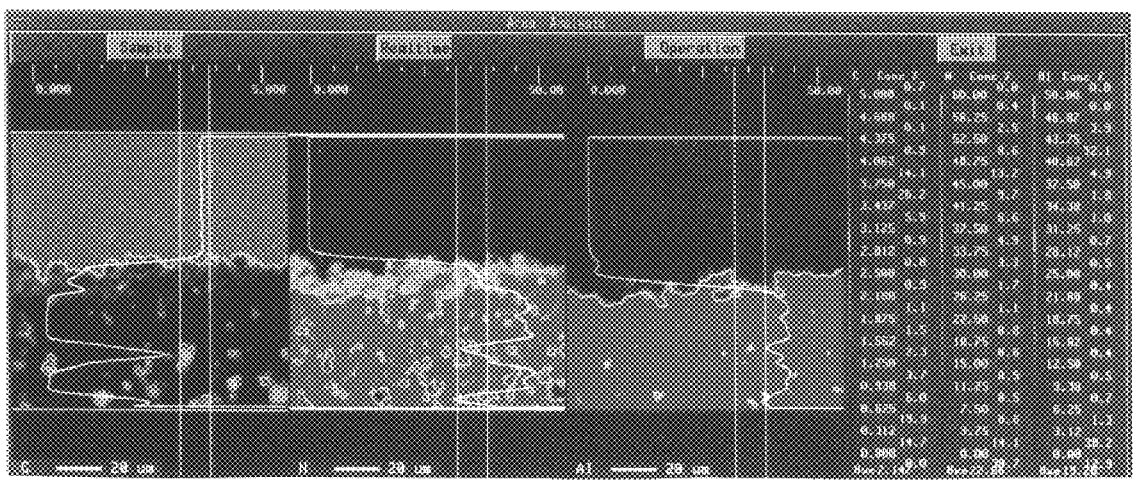
FIG. 3 depicts a result of EPMA, x-ray micro-analysis for carbon, nitrogen, aluminum in a boundary portion or intermediate layer between an aluminum nitride sintered body and the silicon carbide film.
Figure 4:
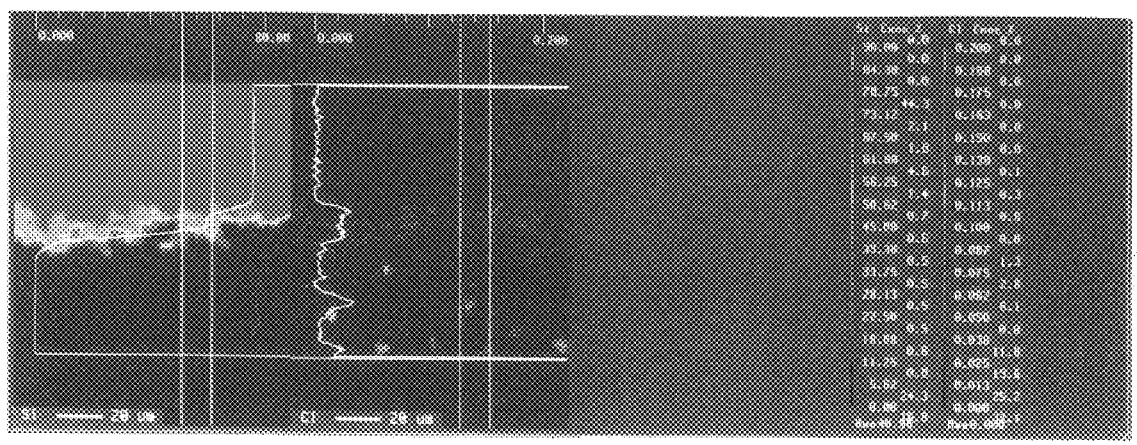
FIG. 4 shows a result of EPMA, x-ray micro-analysis for silicon and chlorine in the boundary portion or intermediate layer between the aluminum nitride sintered body and the silicon carbide film.
Figure 5:
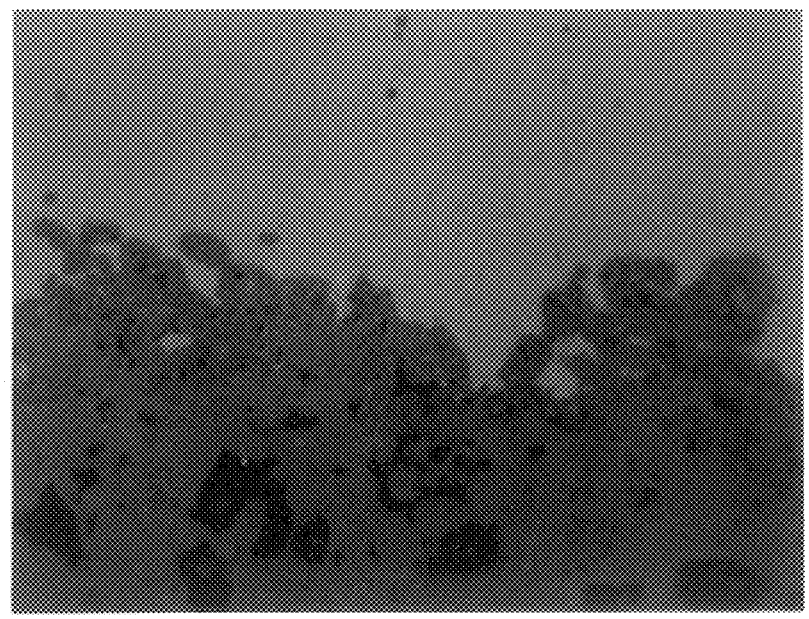
FIG. 5 is a photograph taken by a scanning electron microscope showing a boundary of a structural body according to one embodiment of the invention between the silicon carbide film and the aluminum nitride sintered body.

From the sample piece of the example 1, specimens for microscope observation were cut out, and the thus cut out specimens were further cut out at an angle of 20° with respect to a boundary between aluminum nitride and silicon carbide. Then, the 20° cut out surface of the specimen was ground and the thus ground cut out surface was observed by scanning electron microscope. The result is shown in FIG. 5. In FIG. 5, a lower side was the sintered body and an upper side was the silicon carbide film. Moreover, the intermediate layer having a thickness of about 7 $\mu$m was observed between the sintered body and the silicon carbide film. The intermediate layer was analyzed by using EPMA (X-ray micro-analyzer). The results are shown in FIGS. 3 and 4. A composition of the intermediate layer was 60 wt % of silicon, 35 wt % of nitrogen, 1 wt % of carbon, 2 wt % of aluminum and 0.04 wt % of chlorine. Moreover, the intermediate layer was measured by using micro-focus X-ray. As a result, it was confirmed that there was a silicon nitride crystal corresponding to JCPDS card No. 33-1160 in the intermediate layer.

Figure 6:
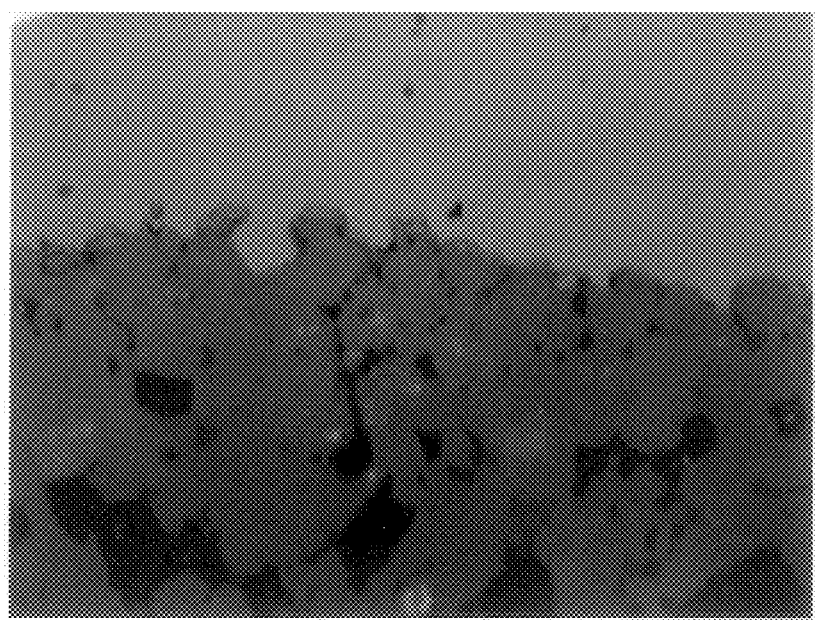
FIG. 6 is a photograph taken by a scanning electron microscope illustrating a boundary of a structural body according to another embodiment of the invention between the silicon carbide film and the aluminum nitride sintered body.
Figure 7:
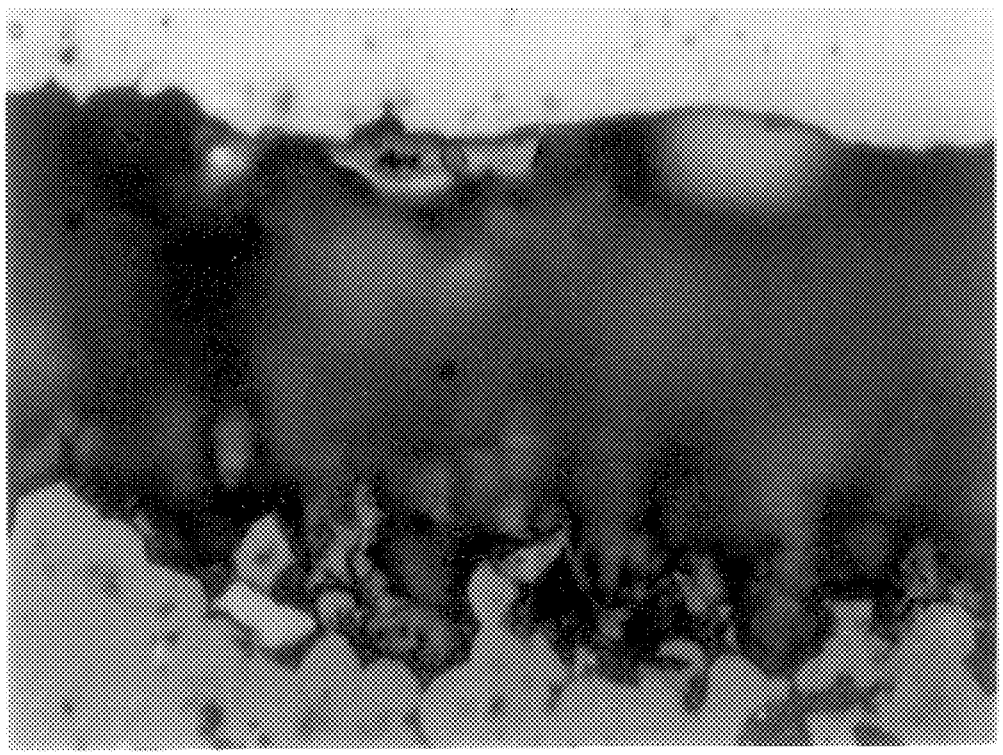
FIG. 7 is a photograph taken by a scanning electron microscope depicting a boundary of a structural body according to a comparative embodiment between the silicon carbide film and the aluminum nitride sintered body.

FIG. 6 shows an observation result of the specimen according to the example 2. The intermediate layer having a thickness of 0.2 $\mu$m was generated. Moreover, FIG. 7 shows an observation result of the specimen according to the comparative example 1. No intermediate layer was generated, and the silicon carbide film was peeled off from the aluminum nitride sintered body.

(Experiment 2)

As is the same as the experiment 1, respective specimens shown in Table 2 were prepared, and the heat cycle test was performed with respect to the thus prepared specimens. In this experiment 2, use was made of propane instead of methane used in the experiment 1. Microstructures of the specimen according to the comparative example 2 was same as those of the specimen according to the comparative example 1, and microstructures of the specimens according to the examples 4, 5, 6 were same as those of the specimens according to the examples 1, 2, 3. In this experiment 2, a thickness of the intermediate layer of the example 4 was 8 $\mu$m, that of the example 5 was 2 $\mu$m and that of the example 6 was 12 $\mu$m. Moreover, a composition of the intermediate layer of the example 4 was silicon nitride as a main ingredient, 3 wt % of aluminum and 4 wt % of carbon, that of the example 5 was silicon nitride as a main ingredient, 4 wt % of aluminum and 3 wt % of carbon, and that of the example 6 was silicon nitride as a main ingredient, 2 wt % of aluminum and 2 wt % of carbon.

TABLE 2

| | | raw material gas introducing method unit: litter/minute | | | | results of heat cycle test | | | | |
|---|---|---|---|---|---|---|---|---|---|---|
| | | temperature | | | predetermined | | | | | |
| | | ascending time | 10 min. | 1 min. | time | 10 | 100 | 1000 | 10000 | 50000 |
| comparative | Ar | 7.5 | | | 7.5 | 0/5 | — | — | — | — |
| example 2 | $H_2$ | | | | 17.5 | | | | | |
| film forming | $SiCl_4$ | | | | 5.2 | | | | | |
| temperature | $C_3H_8$ | | | | 1.3 | | | | | |
| 1425° C. | | | | | | | | | | |
| example 4 | Ar | 7.5 | 7.5 | 7.5 | 7.5 | 5/5 | 5/5 | 5/5 | 5/5 | 5/5 |
| film forming | $H_2$ | | 17.5 | 17.5 | 17.5 | | | | | |
| temperature | $SiCl_4$ | | | 5.2 | 5.2 | | | | | |
| 1425° C. | $C_3H_8$ | | | | 1.3 | | | | | |
| example 5 | Ar | 7.5 | 7.5 | 7.5 | 7.5 | 5/5 | 5/5 | 2/5 | 1/5 | 0/5 |
| film forming | $H_2$ | | 17.5 | 17.5 | 17.5 | | | | | |
| temperature | $SiCl_4$ | | | 5.2 | 5.2 | | | | | |

TABLE 2-continued

| | | raw material gas introducing method unit: litter/minute | | | | results of heat cycle test | | | | |
|---|---|---|---|---|---|---|---|---|---|---|
| | | temperature ascending time | 10 min. | 1 min. | predetermined time | 10 | 100 | 1000 | 10000 | 50000 |
| 1400° C. example 6 film forming temperature 1450° C. | $C_3H_8$ Ar $H_2$ $SiCl_4$ $C_3H_8$ | 7.5 | 7.5 17.5 | 7.5 17.5 5.2 | 1.3 7.5 17.5 5.2 1.3 | 5/5 | 5/5 | 5/5 | 5/5 | 5/5 |

(Experiment 3)

As is the same as the experiment 1, respective specimens shown in Table 3 were prepared, and the heat cycle test was performed with respect to the thus prepared specimens. In this experiment 3, use was made of silane trichloride instead of silicon tetrachloride used in the experiment 1. Microstructures of the specimen according to the comparative example 3 was same as those of the specimen according to the comparative example 1, and microstructures of the specimens according to the examples 7, 8, 9 were same as those of the specimens according to the examples 1, 2, 3. In this experiment 3, a thickness of the intermediate layer of the example 7 was 7 μm, that of the example 8 was 1 μm and that of the example 9 was 10 μm. Moreover, a composition of the intermediate layer of the example 7 was silicon nitride as a main ingredient, 2 wt % of aluminum and 3 wt % of carbon, that of the example 8 was silicon nitride as a main ingredient, 1.5 wt % of aluminum and 3 wt % of carbon, and that of the example 9 was silicon nitride as a main ingredient, 2 wt % of aluminum and 2 wt % of carbon.

TABLE 3

| | | raw material gas introducing method unit: litter/minute | | | | results of heat cycle test | | | | |
|---|---|---|---|---|---|---|---|---|---|---|
| | | temperature ascending time | 10 min. | 1 min. | predetermined time | 10 | 100 | 1000 | 10000 | 50000 |
| comparative example 3 film forming temperature 1425° C. | Ar $H_2$ $SiHCl_3$ $CH_4$ | 7.5 | | | 7.5 17.5 5.2 4 | 0/5 | — | — | — | — |
| example 7 film forming temperature 1425° C. | Ar $H_2$ $SiHCl_3$ $CH_4$ | 7.5 | 7.5 17.5 | 7.5 17.5 5.2 | 7.5 17.5 5.2 4 | 5/5 | 5/5 | 5/5 | 5/5 | 5/5 |
| example 8 film forming temperature 1400° C. | Ar $H_2$ $SiHCl_3$ $CH_4$ | 7.5 | 7.5 17.5 | 7.5 17.5 5.2 | 7.5 17.5 5.2 4 | 5/5 | 5/5 | 3/5 | 2/5 | 0/5 |
| example 9 film forming temperature 1450° C. | Ar $H_2$ $SiHCl_3$ $CH_4$ | 7.5 | 7.5 17.5 | 7.5 17.5 5.2 | 7.5 17.5 5.2 4 | 5/5 | 5/5 | 5/5 | 5/5 | 5/5 |

(Experiment 4)

As is the same as the experiment 1, respective specimens were prepared, and the heat cycle test was performed with respect to the thus prepared specimens. In this experiment 4, film forming temperature, precedent introducing time of silicon tetrachloride and precedent introducing flow amount of silicon tetrachloride were varied as shown in Table 4. These results are shown in Table 4.

TABLE 4

| film forming temperature (° C.) | SiCl$_4$ precedent introducing time (minute) | SiCl$_4$ precedent introducing flow amount (litter/minute) | thickness of intermediate layer ($\mu$m) | heat cycle resistive number (number) |
| --- | --- | --- | --- | --- |
| 1400 | 0 | 0 | 0 | 100 |
| 1350 | 3 | 5.2 | 0.5 | 1000 |
| 1375 | 3 | 5.2 | 0.2 | 1000 |
| 1400 | 1 | 5.2 | 0.2 | 1000 |
| 1400 | 3 | 5.2 | 2 | 10000 |
| 1425 | 1 | 5.2 | 7 | 50000 |
| 1425 | 3 | 5.2 | 10 | 50000 |
| 1450 | 1 | 5.2 | 12 | 50000 |
| 1450 | 3 | 5.2 | 12 | 50000 |
| 1500 | 1 | 5.2 | 4 | 50000 |
| 1500 | 1 | 5.2 | 2 | 50000 |

In this experiment 4, compositions of the intermediate layers according to respective specimens shown in Table 3 were silicon nitride as a main ingredient, 1–3 wt % of aluminum, 1–3 wt % of carbon and 0.02–0.3 wt % of chloring. From these results, it was confirmed that a thickness of the intermediate layer was preferable if it was greater than 0.2 $\mu$m, more preferable if it was greater than 2 $\mu$m and further more preferable if it was greater than 4 $\mu$m.

(Experiment 5)

In the experiment 5, a purity of aluminum nitride in the sintered body was varied as shown in Table 5. Compositions other than aluminum nitride in the sintered body were sintering agents mainly composed of yttrium, ytterbium, oxygen, magnesium, carbon and so on and inevitable impurities. As can be understood from the results shown in Table 5, a purity of aluminum nitride was preferable if it was greater than 90% and more preferable if it was greater than 94%.

TABLE 5

| purity of aluminum nitride (%) | heat cycle resistive number (number) |
| --- | --- |
| 85 | |
| 90 | 10000 |
| 94 | 50000 |
| 99 | 50000 |
| 99.5 | 50000 |

(Experiment 6)

As is the same as the experiment 1, specimens were prepared. In this experiment 6, use was made of a discoid substrate having a thickness of 2 mm and a diameter of 200 mm, which was made of the aluminum nitride sintered body having a purity of 99.5%. On the substrate mentioned above, the silicon carbide film having a thickness of 50 $\mu$m was formed according to the condition of the example 1 in the experiment 1. A thickness of the intermediate layer was 8 $\mu$m. Compositions other than silicon nitride in the intermediate layer were 2 wt % of aluminum, 1 wt % of carbon and 0.05 wt % of chlorine.

The thus prepared specimen was exposed in chlorine plasma at 825° C. In this case, a flow amount of chlorine gas was 300SCCM, a pressure was 0.1 Torr, an alternate current power was 800 watt and an exposed time was 2 hours. As a result, the silicon carbon film was not corroded at all.

Hereinafter, the embodiment, in which the structural body according to the invention is applied to the heater especially to the heater to which corrosive gas is exposed, will be explained.

At first, the heater, in which the silicon carbide film itself is used as a resistance heating element, will be explained.

In the case that a metal resistance heating element is embedded in a substrate made of an aluminum nitride sintered body, it is necessary to arrange portions of the resistance heating element with a spacing so as to prevent a contact between these portions in the substrate. Therefore, when the heater is viewed from a heating surface side, a temperature of the heating surface positioned just on the resistance heating element becomes high, but a temperature of the heating surface positioned on a portion in which the resistance heating element is not embedded becomes low, so that a temperature variation on the heating surface is generated. Moreover, since a heat capacity of the heater becomes larger, it is difficult to perform abrupt heating and cooling operations, and thus a precise temperature control cannot be performed. However, in the case that the resistance heating element is formed by patterning the silicon carbide film, since there is no limitations as that of the heater in which the metal resistance heating element is embedded in the sintered body, it is possible to eliminate the temperature variation on the heating surface mentioned above by making a spacing of the pattern of the silicon carbide film sufficiently smaller. Moreover, in this case, it is possible to perform the abrupt heating and cooling operations.

Further, in the case that a pattern made of a metal film is formed on a surface of the sintered body and the pattern generates heat, there is a case such that the metal film is gradually peeled off due to a difference of thermal expansion coefficient between the metal film and the sintered body when a heat cycle is applied, or, such that a resistance value is varied partially due to an oxidation of the metal film. However, if the silicon carbide film pattern according to the invention is used as the resistance heating element, the resistance heating element is not varied on a surface of the substance even after applying a long term heat cycle.

Figure 8:
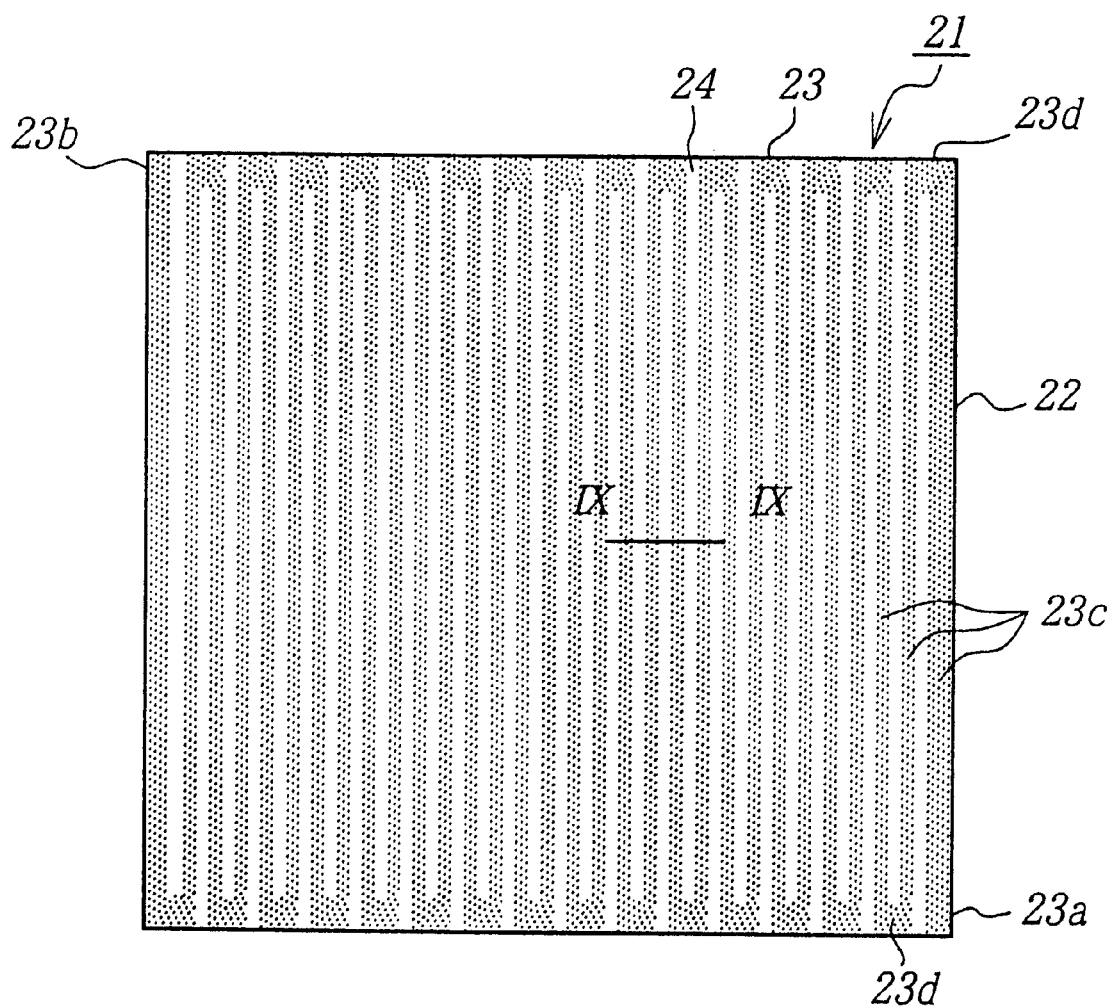
FIG. 8 is a plan view showing one embodiment of a heater in which the silicon carbide film is used as a resistance heating element.
Figure 9:
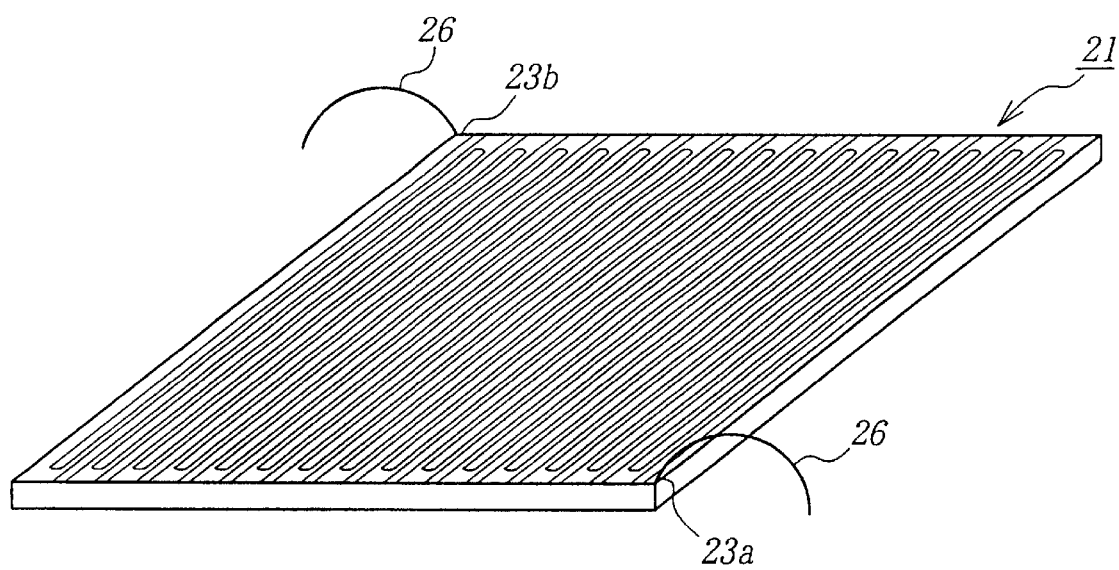
FIG. 9 is a perspective view illustrating the heater shown in FIG. 8.
Figure 10:
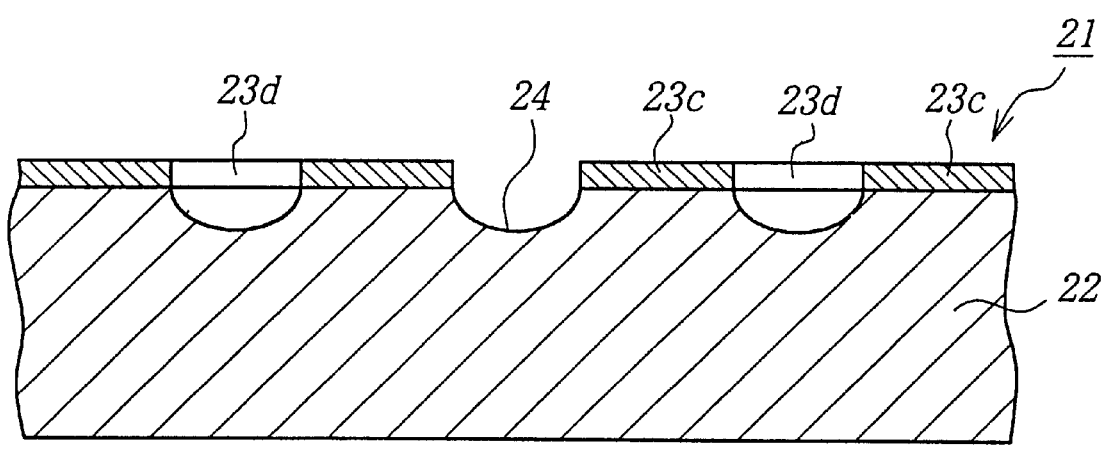
FIG. 10 is an enlarged cross sectional view of the heater shown in FIG. 8.

The inventors produced a heater having a shape as shown in FIGS. 8–10. FIG. 8 is a plan view of a heater 21, FIG. 9 is a perspective view of the heater 21 and FIG. 10 is a partially cross sectional view of the heater 21.

A plate-like substrate 22 having a dimension of 300 mm×300 mm×3 mm and made of an aluminum nitride sintered body having a purity of 99.5% was prepared. A silicon carbide film having a thickness of about 100 $\mu$m was formed on one surface of the substrate 22 according to the method shown in the experiment 1. An intermediate layer having a thickness of 7 $\mu$m was generated at a boundary between the silicon carbide film and the substrate. A main ingredient of the intermediate layer was silicon nitride, and, 2 wt % of aluminum, 1 wt % of carbon, 0.05 wt % of chlorine were included therein.

As shown by the planar pattern illustrated in FIGS. 8 and 9, recesses 24 each having a depth of about 200 $\mu$m and a width of 1 mm were formed by using a diamond cutter and a resistance heating element pattern 23 was formed. The pattern 23 comprised linear portions 23c and connection portions 23d for connecting ends of respective linear portions 23c. A width of the linear portion 23c was 1 mm.

Aluminum nitride was exposed at a bottom of the recess 24. Platinum wires 26 were connected to both ends 23a and 23b of the pattern 23 respectively and a power was supplied to the resistance heating element pattern 23 through the platinum wires 26 so as to generate heat. After a power supply was started, a temperature of a surface of the substrate 22 to which no pattern 23 was formed was measured by using a radiation. As a result, a temperature difference in a region positioned within 8 mm from respective corner portions of the substrate was within 0.4° C., and a temperature was increased uniformly in this region. In addition, since a resolution of the radiation thermometer was 0.5 mm, a substantial temperature distribution was not detected on the heater surface.

Then, the thus prepared heater was subjected to a heat cycle test in argon atmosphere including 5% of hydrogen. One heat cycle was as follows: a temperature of the heater was ascended to 500° C. for 0.5 hour, maintained at 500° C. for 0.1 hour and descended to room temperature for 0.5 hour. After 100 heat cycles, a temperature distribution was measured on the heater surface by using the radiation thermometer. As a result, an average temperature difference was within ±0.2° C. and a temperature distribution was within ±0.4° C., as compared with the heater before the heat cycle test.

In an apparatus for producing semiconductors, a heater in which a metal resistance heating element was embedded in an aluminum nitride sintered body was known. However, a heater was not known which was used preferably under a condition such that a heat cycle between room temperature and a high temperature region such as 600–1100° C. was applied and it was exposed in a corrosive gas especially chlorine corrosive gas. Such a heater was strongly required.

According to the invention, a heater which solved all the disadvantages mentioned above could be achieved by embedding a resistance heating element in an aluminum nitride sintered body, covering overall surface of the sintered body, and forming an intermediate layer at a boundary between the sintered body and the silicon carbon film.

That is to say, the silicon carbide film formed by a chemical vapor deposition method has an extraordinarily high corrosion resistivity with respect to a chlorine corrosive gas in a high temperature region especially in a high temperature region of 600–1100° C. In addition, since the silicon carbide film is integrated with the aluminum nitride sintered body, in which a resistance heating element is embedded, through the intermediate layer, the structural body having a strong heat cycle resistivity can be achieved. This reason is assumed as follows.

That is to say, in the case that the structural body according to the invention is used as a suscepter and a heat from an external heat source (for example infrared lamp) is applied to the suscepter, a heat from the external heat source is first introduced to the silicon carbide film by means of a heat radiation, and then conducted to the aluminum nitride sintered body through the intermediate layer. In this case, all the silicon carbide film is heated rapidly at first and a temperature is extraordinarily increased. Since a thermal expansion coefficient of the silicon carbide film is greater than that of the aluminum nitride sintered body, if both of the silicon carbide film and the aluminum nitride sintered body are heated, the silicon carbide film is expanded largely as compared with the aluminum nitride sintered body and thus a compression stress is applied to the silicon carbide film. In addition, since a temperature of the silicon carbide film is first increased rapidly due to a heat radiation for the silicon carbide film, an excess compression stress is liable to be applied to the silicon carbide film. Therefore, even if taking into consideration of a buffer function of the intermediate layer according to the invention, an abruptions of the film is liable to be generated after the heat cycle is applied.

On the other hand, in this case that the silicon carbide film is integrated through the intermediate layer, with the aluminum nitride sintered body, in which the resistance heating element is embedded, a heat from the resistance heating element is conducted through the sintered body by means of a heat conduction and reaches to the silicon carbide film through the intermediate layer. In this case, since a heat capacity of the sintered body is greater than that of the silicon carbide film and the silicon carbide film is thin, when a heat is conducted from the sintered body to the silicon carbide film through the intermediate layer during a temperature ascending step, a temperature difference between the silicon carbide film and an outermost region of the sintered body is small, and a temperature of the silicon carbide film is lower than that of the sintered body. In addition, since a thermal expansion coefficient of the sintered body is smaller than that of the silicon carbide film, a difference on a thermal expansion between the sintered body and the silicon carbide layer becomes smaller and smaller. Therefore, a stress applied near the boundary between an outermost region of the sintered body and the silicon carbide film during a heating step can be largely relieved and further it is dispersed by the intermediate layer.

As the resistance heating element which is embedded in the aluminum nitride sintered body, metal wire having a coil spring shape, metal foil and metal plate are preferably used, and they are known in a heater filed.

In this embodiment, it is preferred to use a heater in which the resistance heating element is embedded in the aluminum nitride sintered body, at least a part of the resistance heating element is made of a conductive net-like member and an aluminum nitride is filled in a net of the net-like member. The heater having the construction mentioned above shows an extraordinary durability with respect to a heat cycle especially between a high temperature region on a low temperature region such as a room temperature region.

Materials of the net-like member are not limited, but it is preferred to use a metal having a high melting point when a temperature becomes greater than 600° C. during use. As the metal having a high melting point, use is made of tungsten, molybdenum, platinum, rhenium, hafnium and an alloy thereof.

As a configuration of the net-like member, it is preferred to use the net-like member formed by fibers or wires. In this case, if a cross section of the fiber or the wire is circular, it is possible to reduce a stress concentration due to thermal expansion.

In a preferred embodiment, the net-like member should be cut into a slender string like a picture drawn with a single stroke of the brush. In this case, since a current is flowed toward a longitudinal direction of the net-like member formed by the slender strips, an unevenness of temperature distribution due to a current concentration is not liable to be generated as compared with the circular net-like member.

Figure 11A:
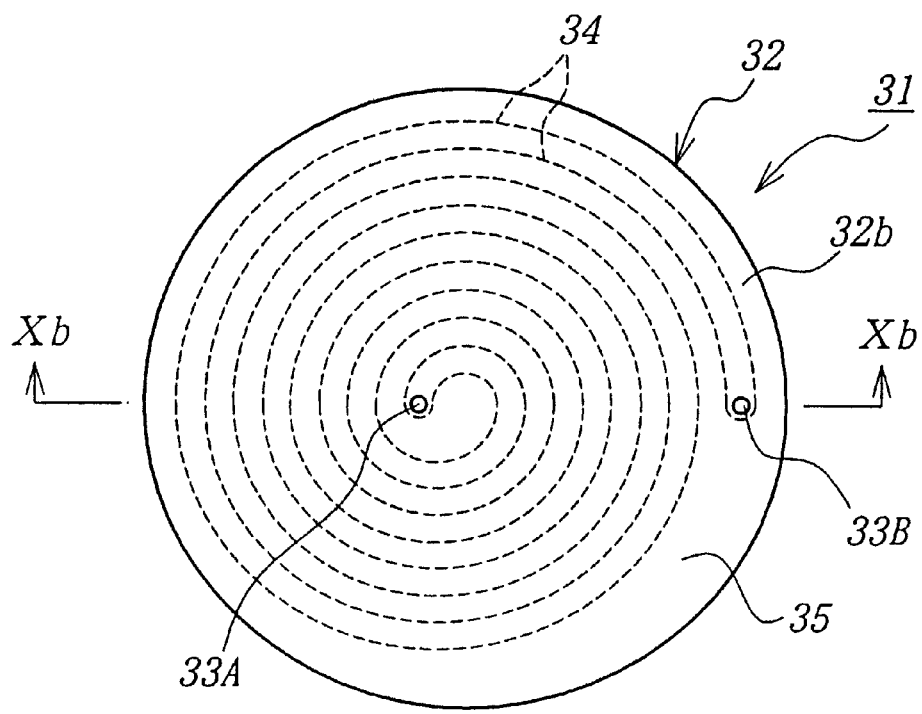
Figure 11B:
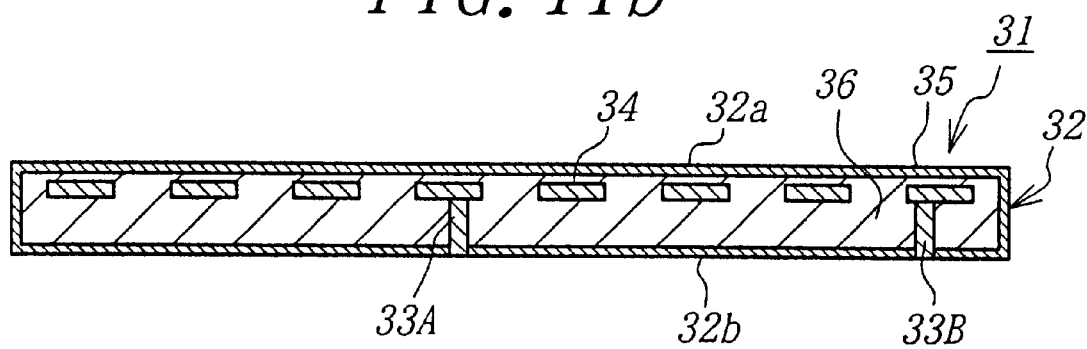

FIG. 11a is a plan view showing a ceramics heater 31 according to another embodiment of the invention and FIG. 11b is a cross sectional view cut along Xb—Xb line in FIG. 11a. In the ceramics heater 31, a net-like member 34 is embedded in a substrate 32 having for example discoid shape.

At a center portion of the substrate 32, a terminal 33A which continues to a rear surface 32b is embedded, and at a peripheral portion of the substrate 32, a terminal 33B which continues to the rear surface 32b is embedded. The terminal 33A and the terminal 33B are connected through the net-like member 34. A numeral 32a is a heating surface. The substrate 32 comprises an aluminum nitride sintered body 36 having a discoid shape and a silicon carbide film 35 which covers a surface of the sintered body 36.

Figure 12A:
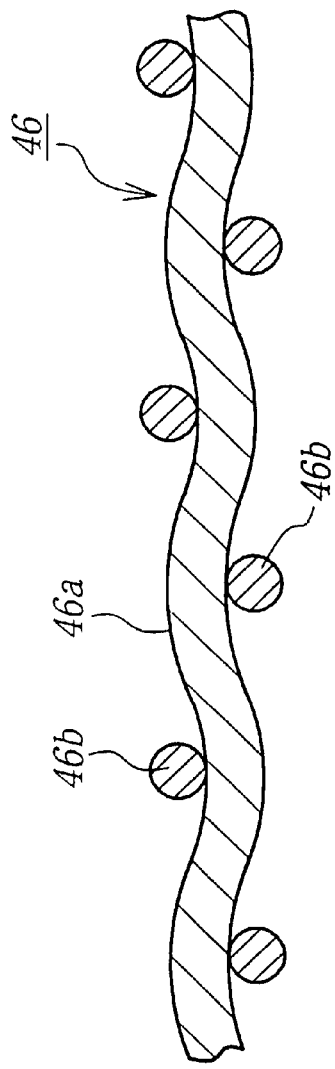
FIGS. 12a, 12b and 12c are cross sectional views respectively illustrating a net-like microstructure which can be used in the present invention.
Figure 12B:
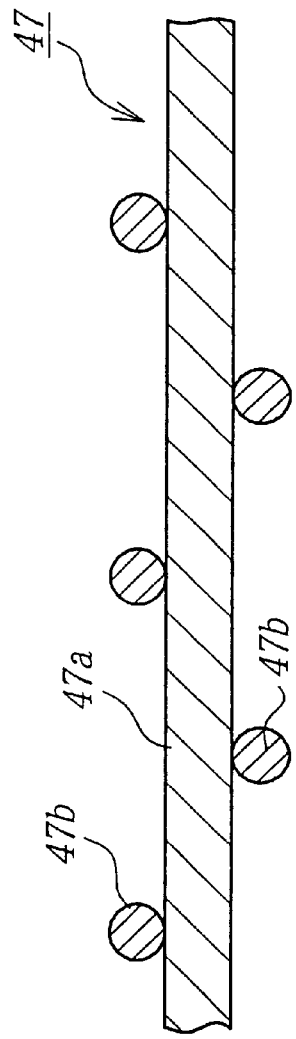
Figure 12C:
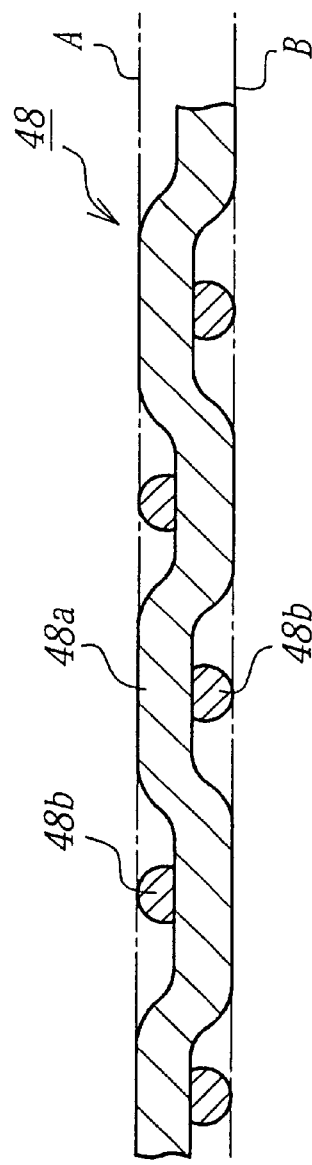

The net-like member 34 is formed by a net having a configuration shown in for example FIGS. 12a–12c. It should be noted that a fine net configuration of the net-like member 34 is not shown in FIGS. 11a and 11b due to a size limitation. The net-like member 34 has a convoluted shape in a major plane between the terminals 33A and 33B. The terminals 33A and 33B are connected to a power supply cable not shown.

FIGS. 12a–12c are cross sectional views respectively showing one embodiment of the net-like member. In a net-like member 46 shown in was 2 wt % of aluminum, 1 wt % of carbon and 0.04 wt % of chlorine. A silicon wafer was set on the heater according to this embodiment. As a comparative example ①, a heater ①, in which no silicon carbide film was formed in the sintered body, was produced. As a comparative example ②, a heater ②, in which the silicon carbide film having a thickness of 50 μm was formed according to the condition of the comparative example 1 in the experiment 1, was produced.

Respective heaters were exposed in a chlorine plasma. In this case, a flow amount of a chlorine gas was 300SCCM, a pressure was 0.1 Torr, an alternating current power was 800 W, and an exposing time was 2 hours. A power was supplied to the resistance heating element of the heater and a temperature of the silicon wafer was maintained at 800° C. As a results, the silicon carbide film was not corroded at all in the example according to the invention ①. However, the substrate was corroded heavily in the comparative example. Moreover, a contamination level of Al with respect to the silicon wafer was as follows. In the heater according to the comparative example ①, a contamination level was $10^{15}$ atm/cm². On the other hand, in the heater according to the invention, a contamination level was $10^{10}$ atm/cm². Since the contamination level of $10^{10}$ atm/cm² was the same as that of the silicon wafer before processing, a plasma heating process could be performed under a condition of substantially no silicon wafer contamination in the heater according to the invention.

Further, since the silicon carbide film has a conductive property, it was possible to prevent a particle adhesion due to an electrostatic potential which was a problem in the aluminum nitride sintered body having an insulation property. Especially, it was possible to prevent a generation of electrostatic potential completely by connecting the silicon carbide film to the ground. FIG. 12a, longitudinal wires 46b and transversal wires 46a are knitted in a three-dimensional manner, and both of the longitudinal wires and the transversal wires waves. In a net-like member 47 shown in FIG. 12b, transversal wires 47a are straight and longitudinal wires 47b are bent. In a net-like member 48 shown in FIG. 12c, longitudinal wires 48b and transversal wires 48a are knitted in a three-dimensional manner, and both of the longitudinal wires and the transversal wires waves. Moreover, the net-like member 48 is worked by a rolling mill, and thus outer surfaces of the longitudinal wires and transversal wires are aligned along one-dotted chain lines A and B.

Hereinafter, an experiment result of the heater in which the resistance heating element is embedded in the sintered body will be explained.

Aluminum nitride powders obtained by a reduction nitriding method were used as raw material powders. In aluminum nitride powders, contents of Si, Fe, Ca, Mg, K, Na, Cr, Mn, Ni, Cu, Zn, W, B, Y were respectively smaller than 100 ppm, and the other metal components except for aluminum were not detected. A preliminarily formed body having a discoid shape was produced by forming the raw material powders by applying one directional stress thereto. A resistance heating element made of molybdenum having a coil spring shape was embedded in the preliminarily formed body. The preliminarily formed body was sintered by a hot press method under a pressure of 200 kgf/cm² at 1900° C. to obtain an aluminum nitride sintered body. The sintered body had a diameter of 250 mm and a thickness of 20 mm.

A silicon carbide film having a thickness of 50 μm was formed on a surface of the sintered body according to the condition of the example 1 in the experiment 1. A thickness of the intermediate layer was 7 μm. A chemical composition other than silicon nitride in the intermediate layer With respect to the heater according to the invention and the heater according to the comparative example ②, the heat cycle test was performed as is the same as the experiment 1. As a result, in the heater according to the invention, the silicon carbide film was not peeled off even after 10000 heat cycles. However, in the heater according to the comparative example ②, the silicon carbide film was peeled off after 20 heat cycles.

As is clearly understood from the above explanations, according to the invention, in the structural body in which the silicon carbide film is formed on a surface of the aluminum nitride sintered body, the silicon carbide film is firmly connected to the sintered body, it is possible to prevent abruption of the silicon carbide film when the heat cycle is applied to the structural body.

What is claimed is:

1. A structural body comprising an aluminum nitride sintered body, a silicon carbide film (a) formed on a surface of said aluminum nitride sintered body and (b) constituting an outermost layer of said structural body, and an intermediate layer generated between said aluminum nitride sintered body and said silicon carbide film, said intermediate layer being mainly made of silicon nitride.

2. The structural body according to claim 1, wherein smaller than 5 wt % of carbon and smaller than 5 wt % of aluminum are included in said intermediate layer.

3. The structural body according to claim 1, wherein a thickness of said intermediate layer is greater than 0.2 μm.

4. The structural body according to claim 1, wherein a purity of said aluminum nitride sintered body is greater than 94%.

5. The structural body according to claim 1, wherein a resistance heater is embedded in said aluminum nitride sintered body.

6. The structural body according to claim 1, further comprising a power supply means for supplying a power to said silicon carbide film, wherein said silicon carbide film functions as a resistance heater when a power is supplied to said silicon carbide film.

7. A method of producing the structural body set forth in claim 1, comprising the steps of, when a silicon carbide film is formed to said aluminum nitride sintered body by means of a chemical vapor deposition method; flowing hydrogen at a film forming temperature; flowing a gas for a first silicon generation compound including at least silicon, chlorine and hydrogen; and flowing a gas for a second silicon generation compound and a carbon generation compound.

8. The method according to claim 7, wherein said first silicon generation compound is a silicon generation compound made of at least one material selected from a group of $SiCl_4$, $SiHCl_3$ and $SiH_2Cl_2$.

* * * * *